United States Patent
Fletout et al.

(10) Patent No.: US 6,779,730 B2
(45) Date of Patent: Aug. 24, 2004

(54) PERFORATED ANTENNA FOR AN INTEGRATED CIRCUIT CARD, AND AN INTEGRATED CIRCUIT CARD INCLUDING SUCH AN ANTENNA

(75) Inventors: Christophe Fletout, Boigny sur Bionne (FR); Jean-Luc Letournel, Olivet (FR); Marie-Cécile Brel, Orleans (FR); Nathalie Dupuis, Chaingy (FR); Norbert Borg, La Ferte St. Aubin (FR); Benoit Thevenot, Olivet (FR); Mickaël Mande, Orleans (FR)

(73) Assignee: Schlumberger Systemes, Montrouge (FR)

( * ) Notice: Subject to any disclaimer, the term of this patent is extended or adjusted under 35 U.S.C. 154(b) by 28 days.

(21) Appl. No.: 09/753,473

(22) Filed: Jan. 3, 2001

(65) Prior Publication Data

US 2001/0011962 A1 Aug. 9, 2001

Related U.S. Application Data

(63) Continuation of application No. PCT/FR99/01633, filed on Jul. 6, 1999.

(30) Foreign Application Priority Data

Jul. 6, 1998 (FR) .............................................. 98 08604

(51) Int. Cl.$^7$ ................................................ G06K 19/06
(52) U.S. Cl. ...................................... 235/492; 343/762
(58) Field of Search ................................. 235/492, 441, 235/442; 343/762, 786, 700 MS, 742, 772, 895, 873; 340/572

(56) References Cited

U.S. PATENT DOCUMENTS

| | | | | |
|---|---|---|---|---|
| 3,653,052 A | * | 3/1972 | Campbell et al. | 343/708 |
| 5,569,879 A | * | 10/1996 | Gloton et al. | 174/52.2 |
| 5,598,032 A | * | 1/1997 | Fidalgo | 257/679 |
| 5,737,698 A | * | 4/1998 | Gabrelian et al. | 455/286 |
| 5,996,897 A | * | 12/1999 | Prancz | 235/492 |
| 6,064,350 A | * | 5/2000 | Uchimura et al. | 343/786 |
| 6,181,278 B1 | * | 1/2001 | Kakimoto et al. | 343/700 MS |

FOREIGN PATENT DOCUMENTS

| | | |
|---|---|---|
| DE | 196 40 260 | 4/1998 |
| WO | WO 97 05569 | 2/1997 |

* cited by examiner

*Primary Examiner*—Diane I. Lee
(74) *Attorney, Agent, or Firm*—Cohen, Pontani, Lieberman & Pavane

(57) ABSTRACT

An antenna for an integrated circuit card includes a conductive track (2) forming at least one turn and having ends (3) comprising conductive layers forming connection terminals (4), the connection terminals (4) being perforated. An integrated circuit card is provided that includes such an antenna.

5 Claims, 4 Drawing Sheets

PERFORATED ANTENNA FOR AN INTEGRATED CIRCUIT CARD, AND AN INTEGRATED CIRCUIT CARD INCLUDING SUCH AN ANTENNA

This application is a U.S. Continuation Application under 35 USC 111 of International Application PCT/FR99/01633 filed Jul. 6, 1999.

FIELD OF THE INVENTION

The present invention relates to an antenna for an integrated circuit card and to an integrated circuit card including such an antenna. Cards of this type can be connected to a reader over a contactless link by radio or magnetic coupling.

BACKGROUND OF THE INVENTION

In a well known embodiment, a card of this type comprises a card body of insulating material having embedded therein an antenna with ends constituted by conductive layers forming connection terminals, and an integrated circuit module received in a cavity of the card body and provided with internal connection areas connected to the connection terminals of the antenna.

The antenna is generally embedded in the body of the card during a laminating operation, i.e. the antenna is disposed between two layers of the card body which are heated and pressed one against the other.

It has been found that the insulating material constituting the body of the card has difficulty in adhering to the copper constituting the connection terminals. This gives rise to poor cohesion of the card body in the vicinity of the connection terminals of the antenna, thereby limiting the strength of the card. This poor cohesion is particularly unfortunate when the connection terminals are large in area. Nevertheless, it is undesirable to reduce this area since a relatively large area makes it easier to position the integrated circuit module relative to the connection terminals of the antenna.

To resolve that problem, proposals have therefore been made to cover the connection terminals in adhesive. The improvement in card body cohesion provided by adhesive is nevertheless insufficient to confer the desired strength to the card.

SUMMARY OF THE INVENTION

An object of the invention is to provide means for ensuring good cohesion of the card body in the vicinity of the antenna connection terminals without reducing the area thereof.

To achieve this object, the invention provides an antenna for an integrated circuit card, the antenna comprising a conductive track forming at least one turn and having ends comprising conductive layers forming connection terminals, the antenna being characterized in that the connection terminals and/or the conductive track are perforated.

Thus, when the antenna and the card body are laminated, card body material on either side of the connection terminals flows through the perforations in the connection terminals and/or the conductive track and welds to itself through the perforations. Cohesion of the card body in the vicinity of the connection terminals and/or the conductive track of the antenna is then high and the strength of the card is improved.

In a particular embodiment, the connection terminals present slots in the form of strips. This strip form serves to obtain a large flow section for the material constituting the card body through the perforations in the connection terminals of the antenna, while nevertheless preserving sufficient conductive area to ensure good electrical connection with the integrated circuit module of the card.

The slots are preferably of undulating outline.

The risk of a connection terminal and/or the conductive track of the antenna breaking when a force is applied to the card is thus minimized regardless of the direction of the force.

The invention also provides an integrated circuit card including an antenna having at least one of the above-specified characteristics.

Other characteristics and advantages of the invention will appear on reading the following description of a particular, non-limiting embodiment of the invention.

BRIEF DESCRIPTION OF THE DRAWINGS

Reference is made to the accompanying drawings, in which.

DETAILED DESCRIPTION OF THE DRAWINGS

Figure 2:
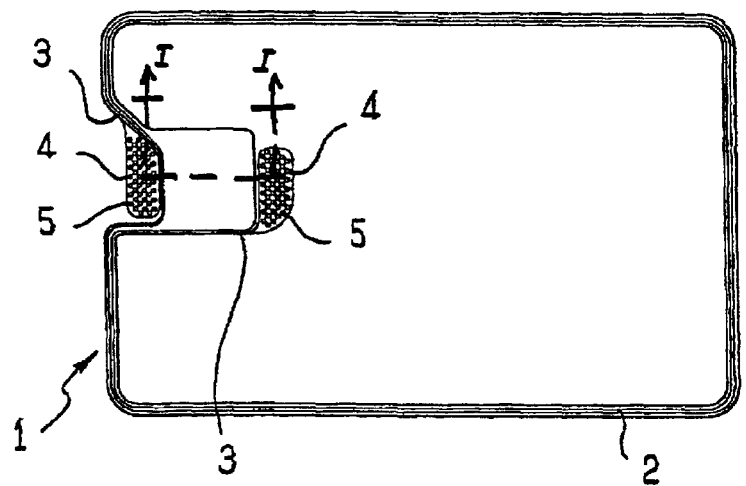
FIG. 2 is a cross section of an antenna in accordance with the invention taken along II—II in FIG. 1.

With reference to FIG. 2, an antenna given overall reference 1 comprises in conventional manner a conductive track 2 made of copper forming turns and having ends 3. Each end 3 comprises a conductive layer forming a connection terminal 4.

In the invention, the connection terminals 4 are perforated.

Figure 3:
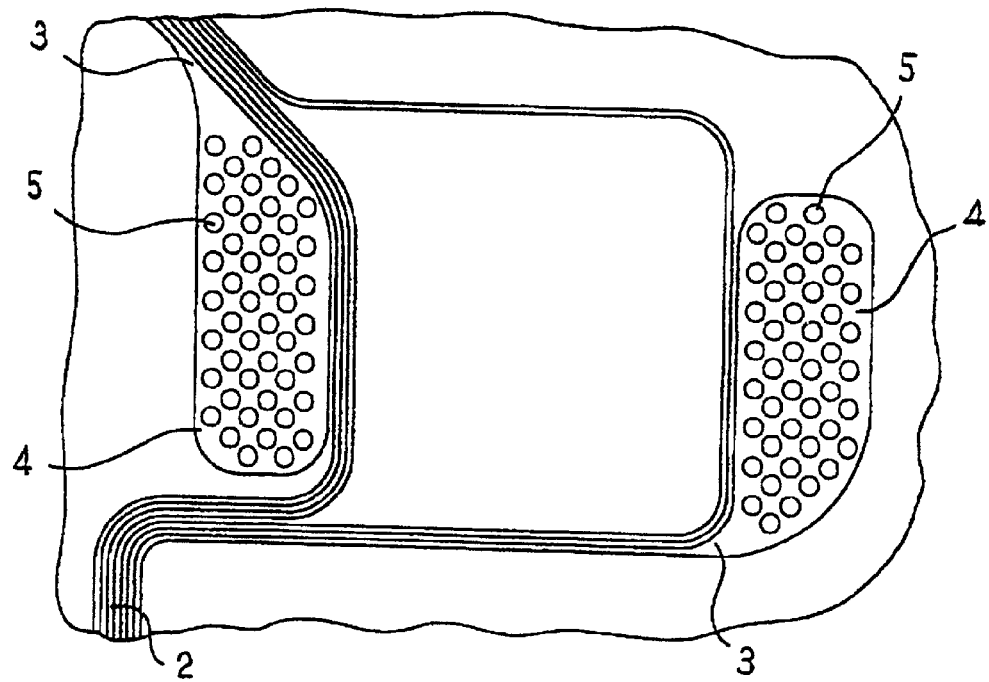
FIG. 3 is a fragmentary view of an antenna constituting a first embodiment of the invention.

With reference more particularly to FIG. 3, and in a first embodiment, the perforations through the connection terminals 4 are constituted by an array of circular holes 5 that are regularly distributed over the entire surface area of the connection terminals.

Figure 4:
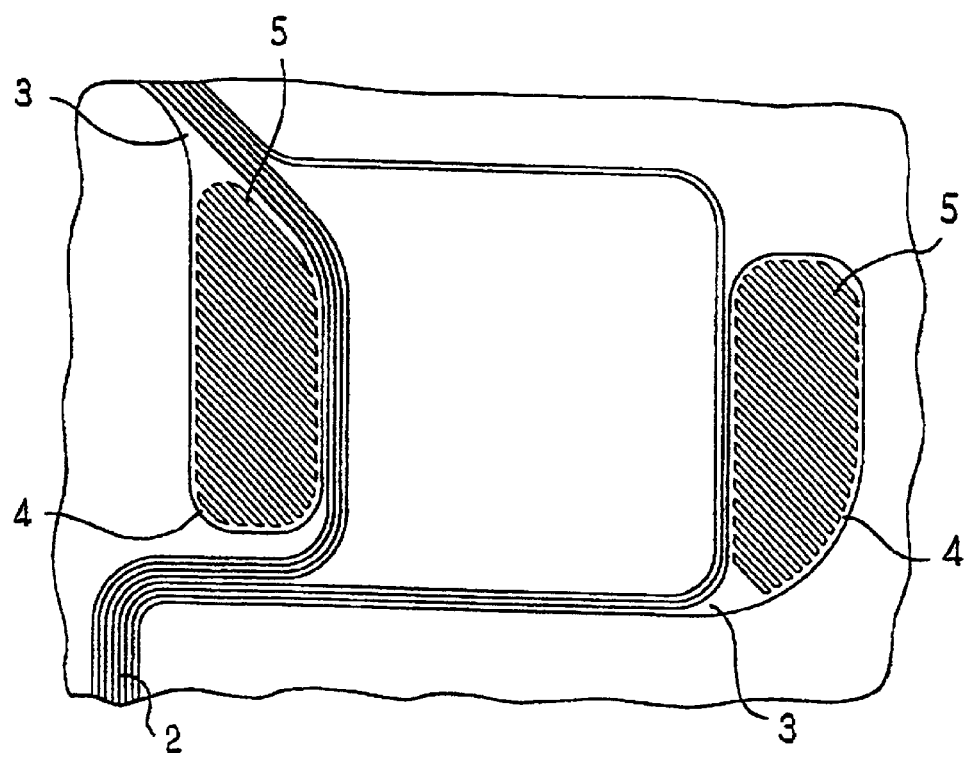
FIG. 4 is a view analogous to FIG. 3 showing a second embodiment of an antenna.

With reference to FIG. 4, and in a second embodiment, the perforations are formed by slots 5 in the form of rectilinear strips. The slots are parallel to one another and they are regularly distributed over the entire surface of each connection terminal 4.

Figure 5:
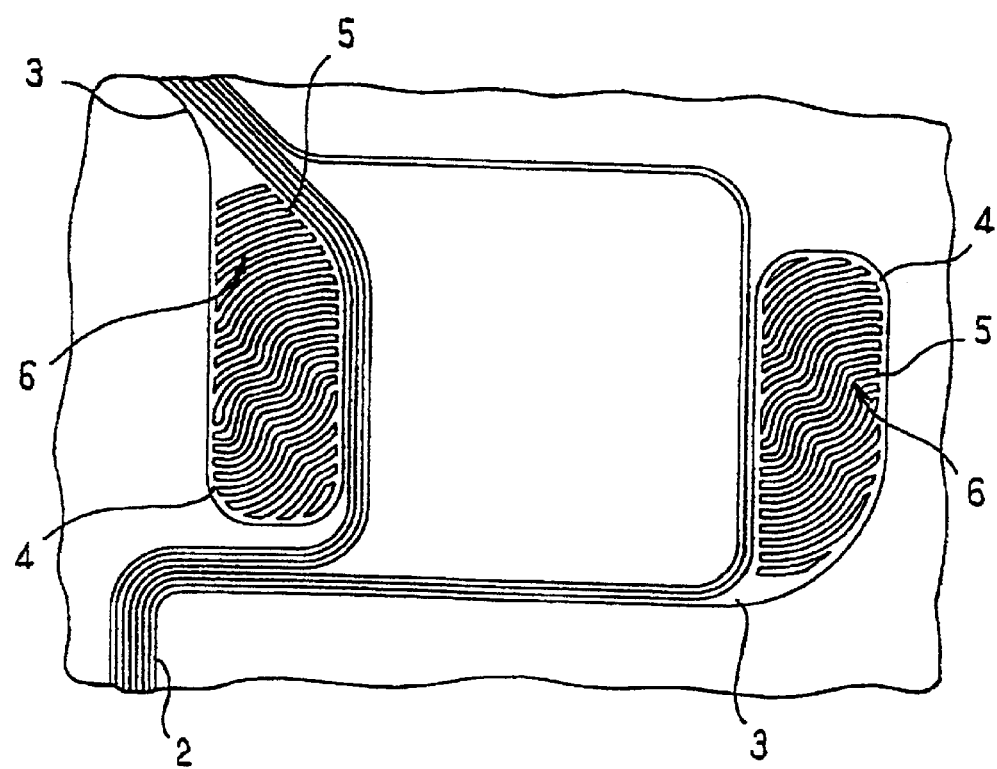
FIG. 5 is a view analogous to FIG. 4 showing an antenna which constitutes a variant of the second embodiment.

In a variant, as shown in FIG. 5, the perforations are formed by slots 5 in the form of strips of undulating outline 6.

Figure 1:
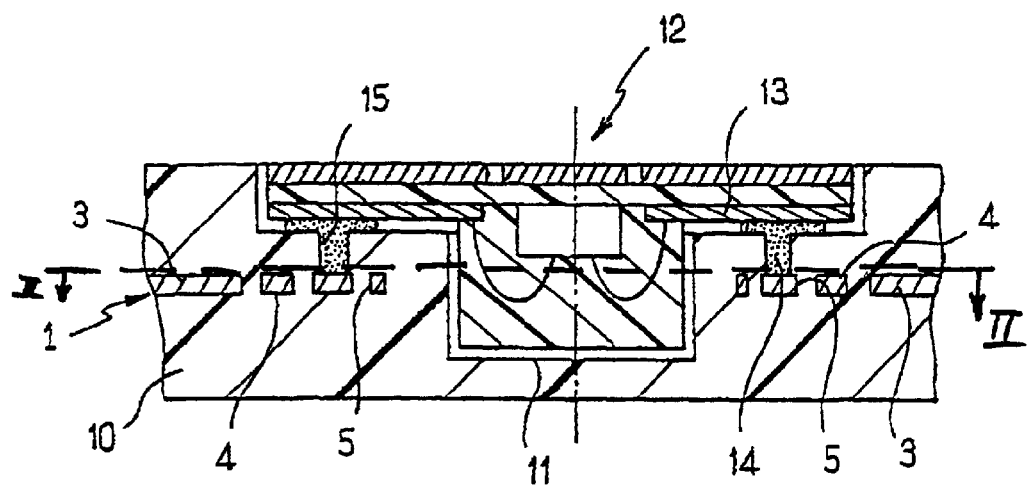
FIG. 1 is a cross section of a card of the invention taken along line I—I of FIG. 2, but without module 12 in position.

With reference to FIG. 1, the integrated circuit card of the invention is, in this case, a card having a combination of both the contact-and contactless types of connection, comprising a card body 10 of insulating material such as polyvinyl chloride.

An antenna 1 identical to the antenna of above-described FIG. 2 is embedded in the card body 10.

The card body 10 has a cavity 11 receiving a module 12 of conventional type provided with internal connection areas 13. The internal connection areas 13 are connected to the connection terminals 4 of the antenna 1 via a conductive adhesive 14, or any other conductive element, received in bores 15 that have been drilled through the card body 10 to extend between the connection terminals 4 and the internal connection areas 13. The conductive adhesive 14 is applied in the form of a droplet after the drilling of the bores and before placing of the module 12 into cavity 11.

In accordance with the invention, the connection terminals 4 have perforations 5 through which the material of the card body 10 surrounding the connection terminals 4 of the antenna 1 extends.

The section of the perforations 5 is advantageously smaller than the section of the bores 15 so as to ensure that good contact can be obtained between the conductive element received in the bore 15, in this case adhesive 14, and the connection terminal 4, even when the bore 15 opens out in registration with a perforation 5.

The card is made by embedding the antenna in the card body 10 by a conventional laminating operation. The antenna 1 supported on a film of material identical to the card body material is placed between two layers of the card body which are then heated and pressed against each other. It will be understood that the material constituting the card body layers and the film flows through the perforations 5 under the effect of the pressure and welds to itself in the perforations.

Naturally, the invention it not limited to the embodiment described and variants can be applied thereto without going beyond the ambit of the invention as defined by the claims.

In particular, the perforations are not limited to the particular shapes described above, but on the contrary can be of any suitable shape. It is also possible to distribute the perforations in differing manner over the surfaces of the connection terminals. For example, there can be more perforations near the peripheries of the terminals than in the centers thereof.

Although the invention is described in association with a particular structure of card with a combination of connection types, the invention applies to any type of card having a combination of connection types and to any type of contactless card.

Figure 6:
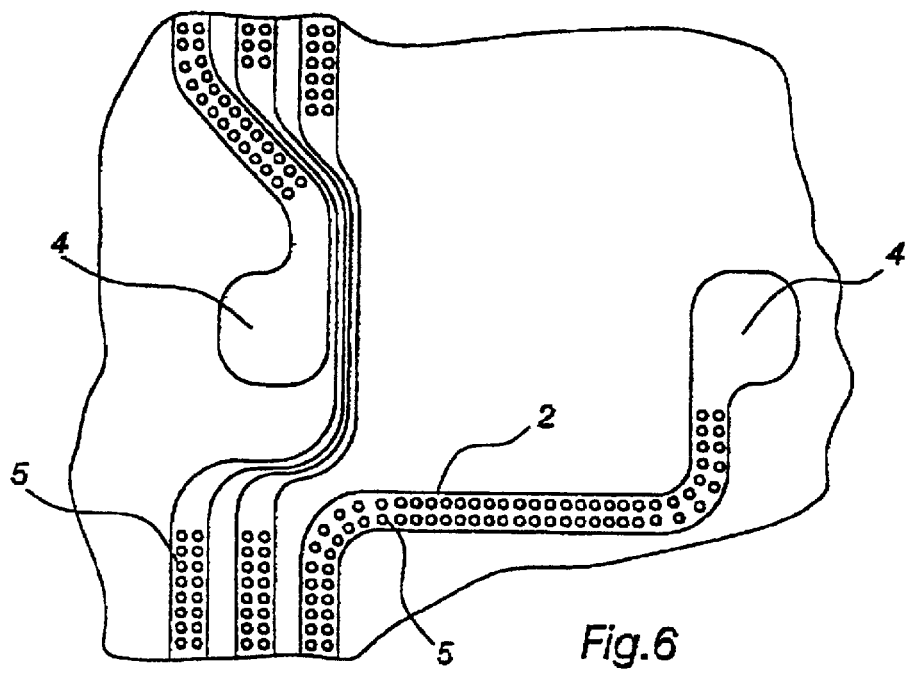
FIG. 6 is a fragmentary view of an antenna constituting another embodiment of the invention.
Figure 7A:
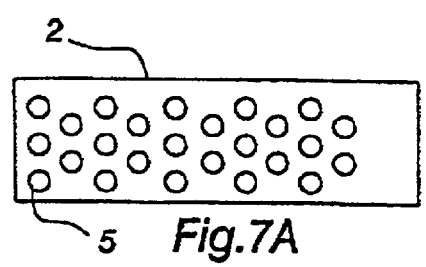
FIGS. 7A, 7B, 7C, 7D and 7E are fragmentary views of different embodiments of the conductive track of an antenna of the invention.
Figure 7B:
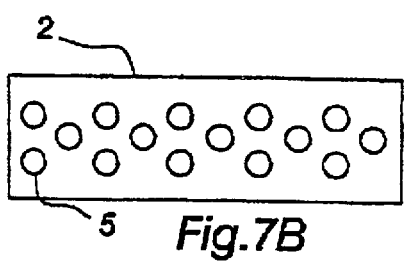
Figure 7C:
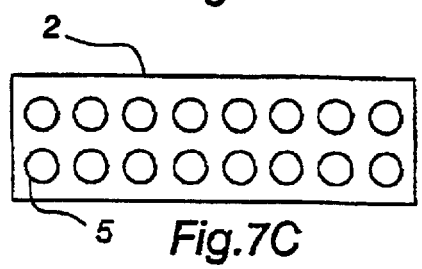
Figure 7D:
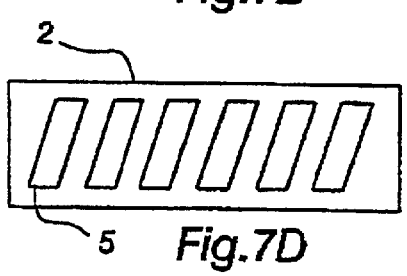
Figure 7E:
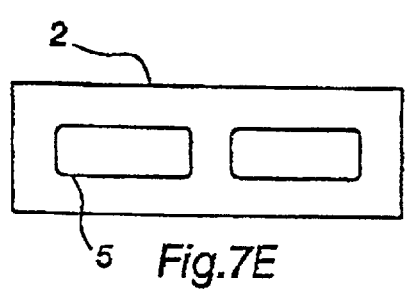

Furthermore, the present description relating to the perforations through the connection terminals 4 can be applied, in accordance with the invention, to the conductive track 2 forming part of the antenna 1. FIG. 6 shows an embodiment of the invention in which only the conducive track is perforated by perforations in the form of circular holes. Nevertheless, this embodiment is not limiting in any way. FIGS. 7A to 7E show various other forms of perforation 5.

In addition, the antenna of the invention can naturally have perforations both in its connection terminals and in its conductive track.

Finally, the invention presents other advantages. In particular, the inductance of antennas of the invention is not altered by the presence of the perforations. Furthermore, given that it is found experimentally that a metallized portion, and in particular a copper-covered portion, contained in a card body and having a width of 0.3 mm leaves a "phantom" image of itself at the surface of the card after lamination, with the phantom image being due essentially to the particular conditions of melting and solidification that apply to the plastic constituting the card body in register with the metal coated portions being different from the melting and solidification conditions that apply to the plastic of said body away from said portions, the invention makes it possible to implement a track that is considerably wider than 0.3 mm but without a phantom image being generated on the surface of the card body.

We claim:

1. An integrated circuit card comprising: a card body of insulating material in which there is embedded an antenna including a conductive track and having ends constituted by conductive layer forming connection terminals, and an integrated circuit module received in a cavity of the card body and provided with internal connection area connected to the connection terminals of the antenna, wherein at least one of the (i) connection terminals and (ii) the conductive track of the antenna has a plurality of perforations, the material surrounding the antenna extending through the perforations in the connection terminals.

2. An integrated circuit card, comprising:

an insulating layer; and a conductive track disposed on said insulating layer and forming an antenna, wherein the conductive track has a plurality of perforations in which portions of the insulating layer are received within said perforations.

3. The integrated circuit card according to claim 2, wherein the plurality of perforations in the conductive track comprises an array of circular holes.

4. An integrated circuit card comprising:

an insulating layer; and a conductive track disposed on said insulating layer and forming an antenna, wherein said conductive track comprises slots formed as strips in which portions of the insulating layer are received within said slots.

5. The integrated circuit card according to claim 4, wherein the slots have an undulating outline.

* * * * *